United States Patent
Kobayashi et al.

(10) Patent No.: US 6,607,115 B2
(45) Date of Patent: *Aug. 19, 2003

(54) JUNCTION BOX

(75) Inventors: Noriko Kobayashi, Yokkaichi (JP); Yukitaka Saito, Yokkaichi (JP); Tatsuya Sumida, Yokkaichi (JP)

(73) Assignee: Sumitomo Wiring Systems, Ltd., Mie (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/908,543

(22) Filed: Jul. 20, 2001

(65) Prior Publication Data

US 2002/0010999 A1 Jan. 31, 2002

(30) Foreign Application Priority Data

Jul. 21, 2000 (JP) ......................................... 2000-220841

(51) Int. Cl.[7] ........................ B23K 31/00; B23K 31/02; H02G 3/18; H05K 1/00
(52) U.S. Cl. ..................... 228/101; 228/135; 228/179.1; 174/99 B; 174/59; 439/76.2
(58) Field of Search ................................. 228/101, 120, 228/135, 179.1; 174/50, 59, 99 B; 439/76.2

(56) References Cited

U.S. PATENT DOCUMENTS

| | | | | |
|---|---|---|---|---|
| 4,180,845 A | * | 12/1979 | Shariff et al. ............ 174/133 B |
| 4,950,168 A | * | 8/1990 | Watanabe et al. .............. 439/34 |
| 4,963,099 A | * | 10/1990 | Sato et al. .................... 439/205 |
| 4,995,818 A | * | 2/1991 | Saimoto ........................ 439/74 |
| 5,898,566 A | * | 4/1999 | Noschese et al. ......... 174/99 B |
| 6,116,916 A | * | 9/2000 | Kasai .......................... 361/826 |
| 6,270,361 B1 | * | 8/2001 | Onizuka et al. ............ 439/76.2 |
| 6,290,509 B1 | * | 9/2001 | Hattori et al. .............. 439/76.2 |
| 6,325,640 B1 | * | 12/2001 | Kasai ........................ 174/71 B |
| 6,394,857 B1 | * | 5/2002 | Crochet ........................ 174/59 |
| 6,402,530 B1 | * | 6/2002 | Saito et al. .................... 439/65 |
| 6,506,060 B2 | * | 1/2003 | Sumida et al. ............. 439/76.2 |
| 2001/0009201 A1 | * | 7/2001 | Kasai .......................... 174/250 |
| 2001/0049211 A1 | * | 12/2001 | Sumida et al. ................ 174/59 |
| 2002/0009907 A1 | * | 1/2002 | Kasai et al. ................ 439/76.2 |
| 2002/0028590 A1 | * | 3/2002 | Saito et al. ................ 439/76.2 |
| 2002/0030036 A1 | * | 3/2002 | Kasai ....................... 219/56.22 |
| 2002/0064975 A1 | * | 5/2002 | Saito et al. ................ 439/76.2 |

FOREIGN PATENT DOCUMENTS

| | | |
|---|---|---|
| EP | 0 867 342 A2 | 9/1998 |
| EP | 0 985 585 A2 | 3/2000 |
| EP | 1145914 A2 * | 10/2001 |
| EP | 1174973 A * | 1/2002 |
| EP | 1179453 A2 * | 2/2002 |

* cited by examiner

Primary Examiner—Tom Dunn
Assistant Examiner—L. Edmondson
(74) Attorney, Agent, or Firm—Oliff & Berridge, PLC

(57) ABSTRACT

An electrical junction box for a vehicle has a connector circuit having bus bars fixed on an insulation substrate to connect to electrical connectors, a fuse circuit having bus bars fixed on an insulation substrate to connect to fuses, and a relay circuit having third bus bars fixed on an insulation substrate to connect to relays in use. In assembling the box, in order to avoid generation of stress and allow for dislocation of the circuits, the method includes the steps of: (i) joining upstanding welding portions of bus bars of the connector circuit and the fuse or relay circuit by arranging them adjacent each other and welding them together; and (ii) after step (i), joining laterally projecting welding portions of bus bars of the connector circuit and the fuse or relay circuits by welding them together when superimposed one on the other.

2 Claims, 8 Drawing Sheets

JUNCTION BOX

BACKGROUND OF THE INVENTION

1. Field of Invention

The present invention relates to a method of assembling an electrical junction box suitable to be connected for example to a wire harness in a vehicle such as an automobile.

2. Description of Related Art

Recently, the increase of electrical and electronic component parts which are mounted in a vehicle has led to increase of circuits to be accommodated in electrical connection boxes and junction boxes in the vehicle. Thus, when forming branch circuits at a high density, it is necessary to mount a large number of component parts on a junction box or the like, which causes increase of manufacturing complexity.

In a junction box disclosed in JP-A-2000-92660 and shown in present FIG. 10, bus bars 5A–5D are laminated one upon another between an upper case part 2 and a lower case part 3, with insulation plates 4A–4E interposed between the bus bars 5A–5D. The upper case part 2 has a connector receiving portion 2a, a relay receiving portion 2b and a fuse receiving portion 2c, on which in use connectors 6, relays 7 and fuses 8 are mounted respectively. Terminals of the connectors 6, the relays 7 and the fuses 8 are connected to tabs 5a projecting from the bus bars directly or are connected to the bus bars through relaying terminals. The lower case part 3 has also a connector receiving portion 3a to connect connectors to tabs projecting from the bus bars.

In the junction box 1, with the increase of the number of circuits, the area and the number of layers of the bus bars increase and thus the size of the junction box becomes large. If the connector, relay and fuse receiving portions are arranged on both the upper and lower case parts to connect connectors, relays and fuses to internal circuits of the junction box, it is possible to make the area of the junction box smaller than in the case where the receiving portions are mounted on only the upper case part or the lower case part.

However, if the connector, relay and fuse receiving portions are mounted on both the upper and lower case parts such that they are opposed vertically, the bent tabs of bus bars must overlap each other and thus cannot be easily arranged. In this case, it is necessary to form tabs on bus bars of other layers, which causes an increase of number of layers of bus bars, and thus leads to the increase of the height of the junction box. That is, the junction box is necessarily large.

Further, the above-described junction box is so constructed that the bus bars are connected to the connectors, the fuses and the relays. Thus, when the specification of the connection between the internal circuit and the fuses and/or the relays is altered, it is necessary to alter the entire internal circuit. Consequently the above-described junction box is incapable of allowing a circuit alteration easily.

Some proposals have been made for replaceable modules in electrical circuits of automobiles.

U.S. Pat. No. 5,179,503 shows a modular automobile power distribution box having replaceable modules carrying relays or fuses. The relays or fuses in each module are directly connected to terminals of leads of wire harnesses. A pair of bus bars connect power terminals to the fuses of three maxi-fuse modules. There is no discussion of interconnection of the modules.

U.S. Pat. No. 5,581,130 discloses removable multi-function modules in individual casings which are mounted on a circuit board. Each module is electrically connected to the power supply distribution layer of the board by a pin. Alternatively three modules are shown connected together by two electrical and mechanical coupling bars.

SUMMARY OF THE INVENTION

It is an object of the present invention to provide a method of assembling a junction box which can be made thin without increasing the number of layers of bus bars to be accommodated therein and which can cope with a circuit alteration easily.

According to the present invention, there is provided a method of assembling an electrical junction box adapted to provide electrical connection to a plurality of electrical connectors, a plurality of fuses and a plurality of relays. The method includes:

(i) assembling in a casing the following components:
  (a) a connector circuit having at least one connector circuit insulation substrate having opposite main surfaces and a periphery around the main surfaces, a plurality of first bus bars fixed on the insulation substrate, the first bus bars being arranged to provide electrical connection to electrical connectors in use and having at least one first welding portion at an end of one of the first bus bars and standing up from one of the main surfaces and at least one second welding portion formed at an end of one of the first bus bars and extending laterally from the periphery of the insulation substrate;
  (b) a fuse circuit having at least one fuse circuit insulation substrate, which is discrete from the connector circuit, and a plurality of second bus bars fixed on the fuse circuit insulation substrate, the second bus bars being arranged to provide electrical connection to fuses in use; and
  (c) a relay circuit having at least one relay circuit insulation substrate, which is discrete from the connector circuit, and a plurality of third bus bars fixed on the relay circuit insulation substrate, the third bus bars being arranged to provide electrical connection to relays in use;
  at least one of the fuse circuit and the relay circuit having a third welding portion at an end of a bus bar thereof and upstanding away from the insulation substrate thereof and a fourth welding portion at an end of a bus bar thereof and extending laterally from the insulation substrate thereof;

the assembling step including the steps of:

(ii) joining the first and third welding portions to form a welded connection by arranging them lying adjacent each other and welding them together; and (iii) after step (ii), joining the second and fourth welding portions to form a welded connection by welding them together when superimposed one on the other.

The present invention also provides a junction box assembled by the above-described method.

The electrical junction box of the present invention has a modular construction. As described above, in the junction box of the present invention, the fuse circuit substrate and the relay circuit substrate are separately provided from the connector circuit substrate and are then joined by welding of the welding portions.

A connector module, which includes the connector circuit, has a welding portion formed by vertically projecting the end of the bus bar from the upper surface of the insulation substrate and a welding portion projected horizontally from the periphery of the insulation substrate. A fuse module and/or a relay module to be connected to the connector module respectively include the fuse circuit and the relay circuit, and have a welding portion formed by projecting an end of a bus bar from the periphery of an insulation substrate at one side thereof and bending it perpendicularly, i.e., vertically away from the insulation substrate. The fuse and/or relay module also have a welding portion formed by horizontally projecting the end of a bus bar from the periphery of the insulation substrate at the other side thereof.

The fuse module and/or the relay module are disposed at a predetermined position relative to the connector module by superimposing them on each other. The bus bars of the connector module and those of the fuse module and/or the relay module are connected to each other by superimposing and welding the corresponding vertical welding portions to each other and the corresponding horizontal welding portions to each other.

In the junction box of the present invention, the connector module, the fuse module and the relay module are separately formed by separately providing the connector connection circuit to be connected to external wires through a connector, the fuse circuit and the relay circuit. That is, the connector connection circuit bus bars, the fuse connection bus bars, and the relay connection bus bars are separately provided.

Alternatively, as described below, the fuse circuit and the relay circuit may be integrated.

In contrast, in the conventional method, in which electrically conductive sheets are punched to form unitarily the connector connection circuit, the fuse connection circuit and the relay connection circuit and form tabs to be connected to connectors, tabs to be connected to fuses, and tabs to be connected to relays and stacked in a single stack, the circuits thus being handled and arranged in a complicated manner. Consequently, in the conventional method, the area of the bus bars increases and a large number of bus bars are necessary.

On the other hand, in the present invention, because the circuits are separately provided and welded to join them, it is possible to avoid the complication of tabs overlapping each other and avoid a large number of bus bars. Thus, it is possible to form a thin or compact junction box. Further, because the circuits of the bus bars can be handled and arranged easily, the area of each bus bar can be reduced. Consequently, even though the bus bars are separately provided for the connector connections on the one hand and the fuse connections and the relay connections on the other hand, it is possible to reduce the total area of the bus bars and avoid increase of the area of the junction box.

Further, the connector module having the connector circuit, the fuse module having the fuse circuit and the relay module having the relay circuit are all separately provided, i.e., the respective insulation substrates are discrete from each other. Thus, if any one of the specification of the connector circuit, the fuse circuit, and the relay circuit is altered, only the design of any one of the modules need be changed. That is, the construction can cope with the alteration of the specification easily.

The fuse module and/or the relay module are for example located at a predetermined position relative to the connector module by superimposing the fuse module and/or the relay module on the connector module. The bus bars are connected to each other by welding the upstanding welding portions to each other and the lateral welding portions to each other. The connector connection bus bar is provided separately from the fuse connection bus bar or/and the relay connection bus bar but connected thereto by welding. Thus the construction does not reduce reliability of the electrical connections. The welding portions are superimposed on each other and connected to each other by ultrasonic welding, resistance welding, laser welding or gas welding.

Typically, when welding the welding portions formed at the ends of the bus bars, a welding portion formed at an end of one bus bar, and, for example, projecting at a periphery of the fuse module and/or the relay module, and bent upward, is arranged alongside and welded to a welding portion of an end of another bus bar projecting upward from an upper surface of the insulation member of the connector module. Thereafter a welding portion formed at an end of a bus bar, e.g., projecting laterally from a periphery of the fuse module and/or the relay module, is superimposed with and welded to a welding portion of an end of a bus bar projecting laterally from the periphery of the connector module. Thereby the connector module and the fuse module and/or the relay module are connected to each other. Thus, initially, the welding portions perpendicular to the insulation substrates of the connector module and the fuse module and/or the relay module are welded to each other. Thus, even though the position of the insulation substrate of the fuse module and/or the relay module is dislocated horizontally relative to the insulation substrate of the connector module owing to deformation of the bus bars caused by thermal expansion or shrinkage or compression caused by mechanical deformation thereof, such dislocation can be permitted. This is because the laterally projecting welding portions are superimposed on each other in such a way that their main surfaces are parallel with the dislocation direction of the insulation substrate of the fuse module and/or the relay module. Accordingly, it is possible to smoothly weld the laterally projecting welding portions to each other in a subsequent welding process. Further, there is no possibility that a large stress remains in the welding portions.

Although the fuse circuit and the relay circuit may be separately formed, it is possible to integrate them with each other to form a fuse/relay composite circuit which receives fuses and relays on the same substrate which has bus bars for fuses and relays on it. In this case, if it is necessary to connect the circuit of any of the bus bars for fuses to any of the bus bars for relays, the respective bus bars may be welded to each other, or the bus bars may be integrally formed.

BRIEF DESCRIPTION OF THE DRAWINGS

Embodiments of the invention will now be described by way of non-limitative example with reference to the accompanying drawings. In the drawings.

DETAILED DESCRIPTION OF PREFERRED EMBODIMENTS

Exemplary embodiments of the present invention will be described below with reference to drawings.

Figure 1:
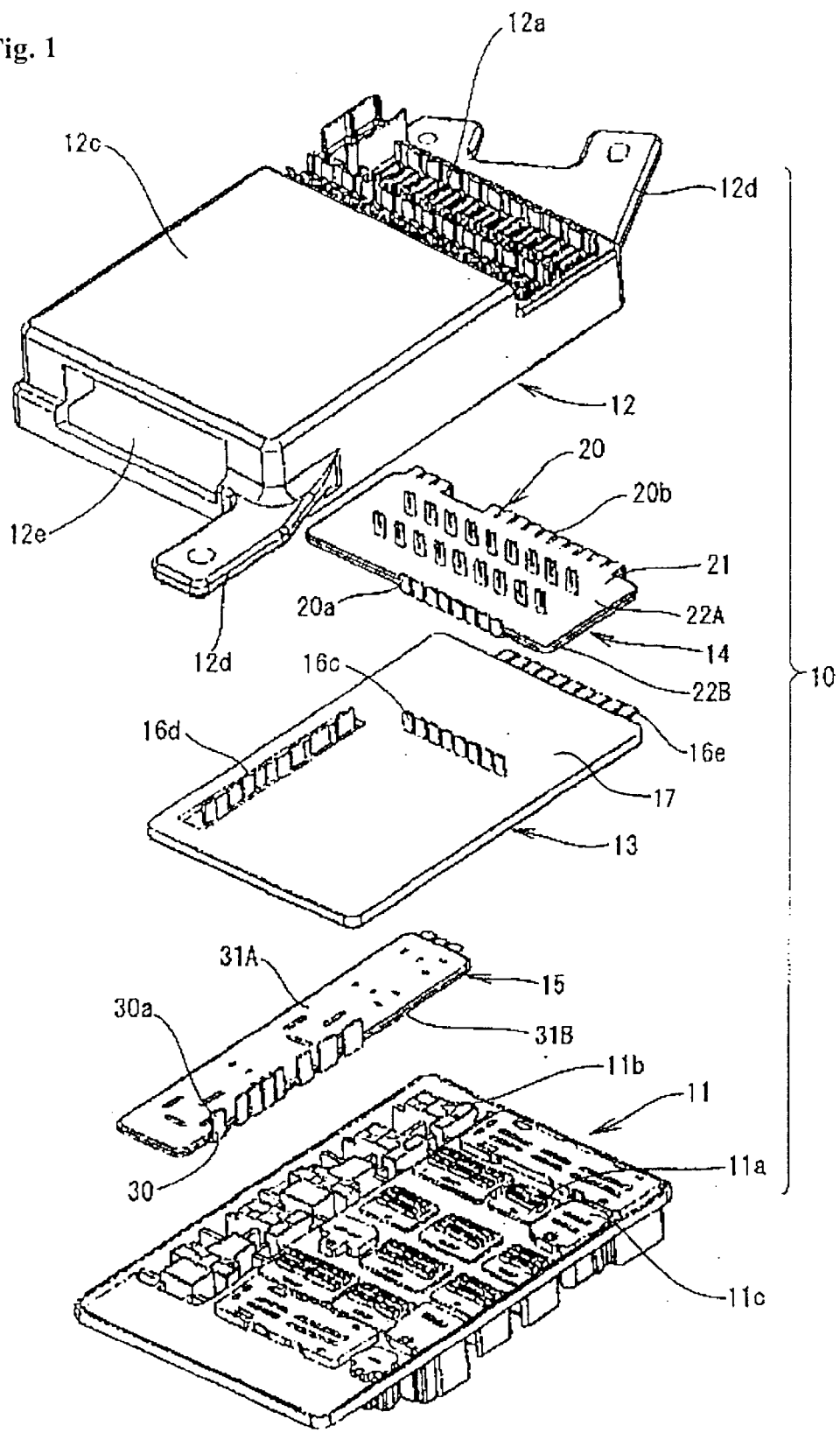
FIG. 1 is a schematic exploded perspective view showing a junction box of a first embodiment of the present invention.

FIG. 1 is a schematic exploded perspective view showing component parts constituting a junction box 10 which, in use, is mounted in a vehicle body and is connected to a wire harness of the vehicle body. The box has a casing formed of molded synthetic resin comprising upper and lower casing parts herein called lower case part 11 and upper case part 12. In the casing are a connector module 13 constituting a connector circuit, a fuse module 14 constituting a fuse circuit and a relay module 15 constituting a relay circuit. Although not shown in FIG. 1, the casing formed by the lower case part 11 and the upper case part 12 accommodates an electronic control unit 40, seen in FIGS. 2 and 3.

The lower case part 11 has a plurality of connector receiving portions 11a in the form of sockets projecting outwardly and a plurality of relay receiving portions 11b also in the form of sockets arranged in a row along one longitudinal side. The upper case part 12 has a fuse receiving portion 12a having sockets to receive a plurality of fuses, formed at one widthwise side. The remaining part of the upper case part 12 is formed as a closed portion 12c which covers and contacts the upper surface of the electronic control unit 40 housed within the case. The upper case part 12 also has a connector receiving portion or socket 12e on the periphery face of its other widthwise side. The lower case part 11 and the upper case part 12 are locked to each other by fitting their peripheral walls on each other. Suitable conventional locking fittings (not shown) may be provided. The upper case part 12 also has fixing brackets 12d projecting from its opposite ends, for fixing it to for example a vehicle body.

Figure 4:
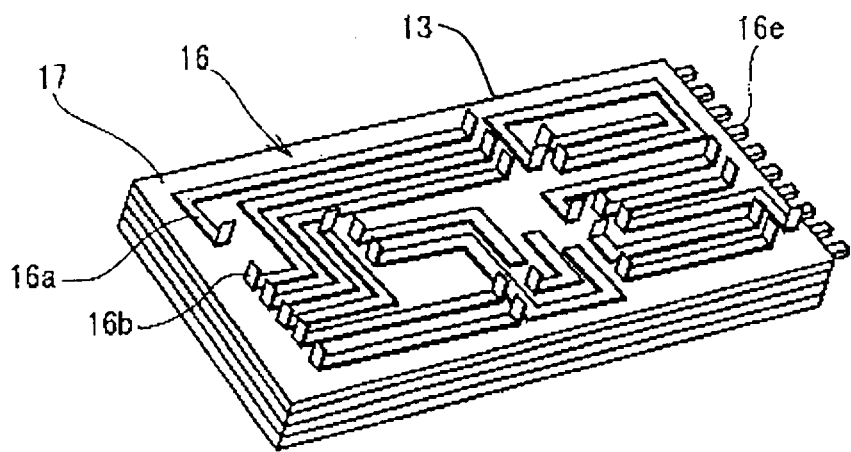
FIG. 4 is a schematic perspective view of a connector module of the box of FIG. 1 viewed from the underside thereof.

FIG. 4 is a schematic perspective view showing the bottom side of the connector module 13 of FIG. 1. The connector module 13 has a plurality of layers of connector connection bus bars 16 laminated one upon another with interposed insulation plates in a stack 17. In this embodiment, there are four layers of the connector connection bus bars. In FIG. 1, the connector module 13 is schematically shown, with one insulation plate of the stack 17 as the uppermost layer. By molding in resin, it is possible to form the insulation plate stack 17 and a multi-layer integral assembly of the bus bars 16.

Each layer of the bus bars 16 of the connector module 13 has circuit portions 16a having a required configuration obtained by punching a conductive plate. At least one tab 16b stands perpendicularly from each circuit portion 16a towards the lower case part 11 to project through a terminal hole 11c of one of the connector receiving portions 11a of the lower case part 11. A connector (not shown) secured on one end of a wire harness is in use fitted in the connector receiving portion 11a to connect a terminal in the connector to the tab 16b.

As shown in FIG. 1, the connector connection bus bars 16 have welding tabs 16c, 16d, projecting from holes of the insulation plate stack 17 at the upper side of the connector circuit 13 and welding tabs 16e projecting from the periphery of the insulation plate stack 17. The welding tabs 16c, 16e are welded to fuse connection bus bars 20 formed on the fuse module 14. The welding tabs 16d are welded to relay connection bus bars 30 formed on the relay module 15 which project upwardly through a slot in the connector module 13. The welding tabs 16c and the welding tabs 20a of the bus bars 20 are placed adjacent each other vertically. Similarly the welding tabs 16d and the welding tabs 30a of the bus bars 30 are placed adjacent each other extending vertically. The welding tabs 16e are welded to welding tabs 20b of the fuse connection bus bars 20 by laminating them on each other vertically and horizontally. There are thus a plurality of sets of each of the welding tabs 16c, 16d and 16e in each case parallel with one another.

Figure 5:
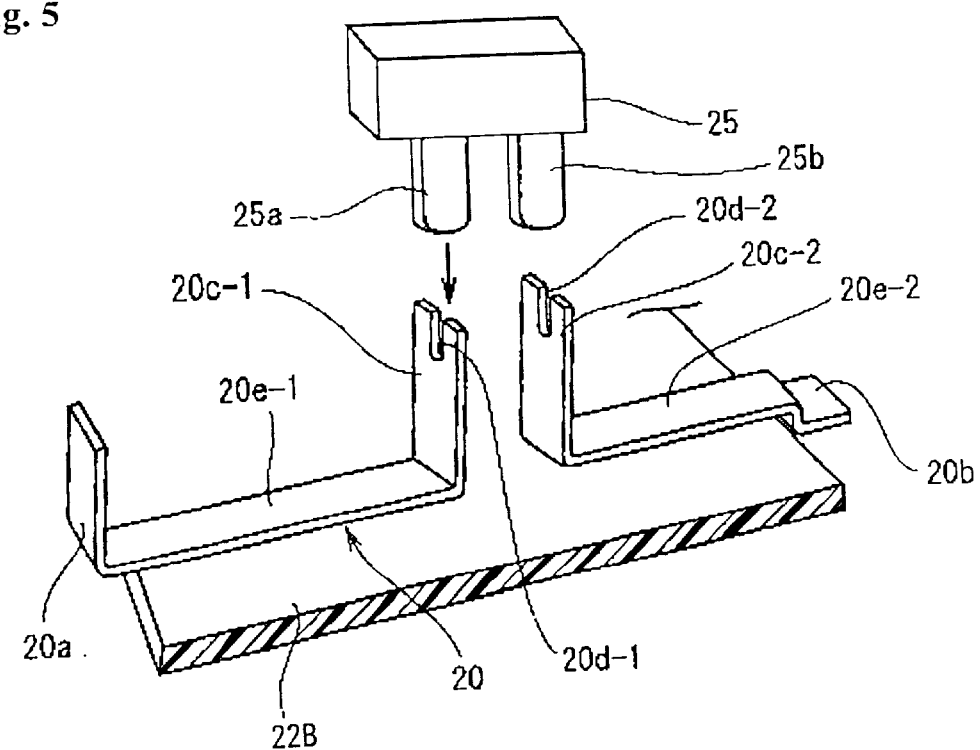
FIG. 5 is a schematic view showing fuse connection bus bars.

The fuse module 14, partly shown schematically in FIG. 5, has the fuse connection bus bars 20 arranged between two superimposed insulation plates 22A and 22B (see FIG. 1), formed by molding resin. The fuse connection bus bars 20 in use connect to terminals 25a or 25b of replaceable fuses 25. As shown in FIG. 5 (where the upper insulation plate is not shown), each fuse connection bus bar 20 has horizontal portions 20e-1 and 20e-2 fixed to the substrate 22B, terminal portions 20c-1 and 20c-2 formed by bending the fuse connection bus bar 20 upward at one end of the horizontal portion 20e-1 and 20e-2, and pressure connection grooves 20d-1 and 20d-2 formed at the upper end of the terminal portions 20c-1 and 20c-2 respectively to allow the terminals 25a and 25b of the fuse 25 to be fitted in the grooves 20d-1 and 20d-2 respectively. The end of one bus bar 20 opposite to its end to be connected to the terminal 25a projects to form the welding portion 20a. The end of the other bus bar 20 opposite to its end to be connected to the terminal 25b projects laterally to form the welding portion 20b. The welding portion 20a is projected horizontally from one edge of the substrate 21 in its longitudinal direction and bent vertically upward so that in the assembled position the welding portion 20a and the welding portion 16c of a connector bus bar 16 lie adjacent each other, as shown in FIG. 7. The welding portion 20b is projected horizontally from the other longitudinal side of the substrate 21 and stepped vertically downward so that in the assembled condition the welding portion 20b and the welding portion 16e of a connector bus bar 16 are superimposed, as also shown in FIG. 7. It is possible to fix the bus bar 20 to the insulation plate 22B by means of caulking. In this case, a caulking projection (not shown) is formed on the insulation plate 22B and inserted through a hole formed on the bus bar 20. Then, the caulking projection is deformed to fix the bus bar 20 at a predetermined position.

The relay module 15 has a construction similar to that of the fuse module 14. More specifically, the relay module 15 has a large number of relay connection bus bars 30 fixed between upper and lower insulation plates 31A and 31B (see FIG. 1). The bus bars 30 are separated from each other and individually connected to terminals of relays in use. As shown schematically in FIG. 6 (where the insulation plate 31B is not shown), each bus bar 30 of the relay module 15 has a horizontal portion 30b, a terminal portion 30c formed by bending the bus bar 30 upwards at one end of the horizontal portion 30b, and a pressure connection groove 30d formed at the outer end of the terminal portion 30c to allow a terminal 35a of a relay 35 to be fitted therein. The welding tab 30a is formed by bending the other end of the horizontal portion 30b in the shape of an "L" to permit the welding tab 30a and the welding tab 16d of one of the connector bus bars 16 to be aligned adjacent each other vertically in the assembled state.

Figure 7A:
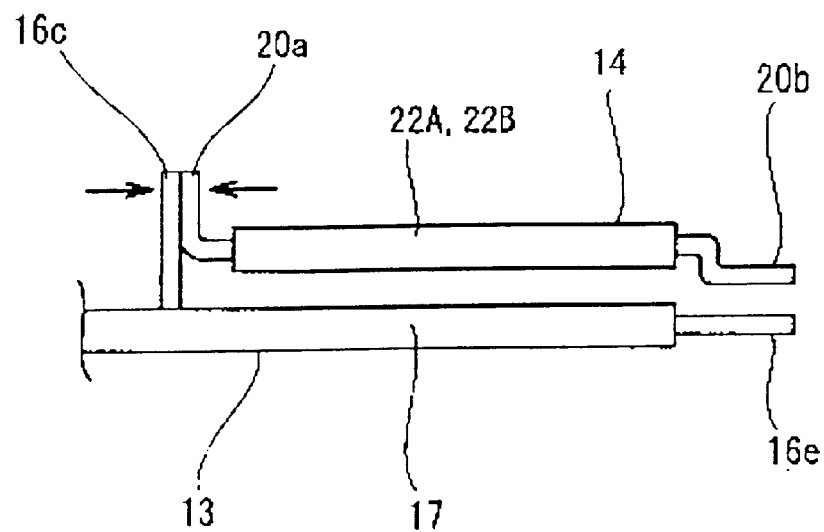
FIGS. 7A and 7B show stages in the process of welding the connector module and the fuse module to each other.
Figure 7B:
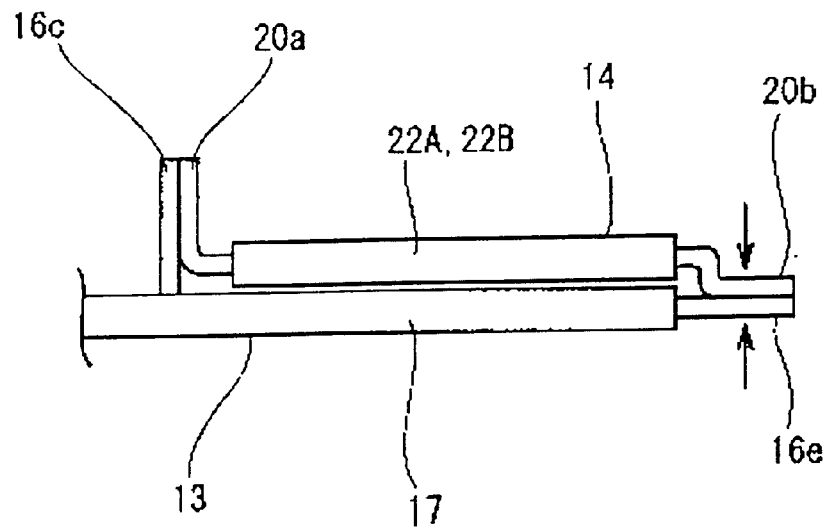

In assembling the junction box 10 of FIG. 1, initially the fuse module 14 is disposed over one portion of the connector module 13. Then, as shown in FIG. 7A, the upstanding welding portion 20a is welded to the adjacent welding portion 16c projecting vertically from the upper surface of the insulation plate 17 of the connector module 13. Thereafter, as shown in FIG. 7B, the welding portion 20b projecting horizontally from the periphery of the fuse module 14 at the other side thereof is welded to the welding portion 16e projecting horizontally from the periphery of the connector module 13 with the former superimposed on the latter. In this manner, the connector module 13 and the fuse module 14 are connected to each other.

In welding the welding portions 16c and 20a to each other and the welding portions 16e and 20b to each other, there is a possibility that the connector module 13 and the fuse module 14 are dislocated (incorrectly located) from each other due to deformation of the bus bars 16, 20 caused by thermal expansion or contraction, or by mechanical deformation thereof caused by compression. To prevent adverse effects of such dislocation, as described above, the welding portions 16c, 20a both project perpendicularly to the insulation plate 17 of the connector module 13 and to the insulation plates 22A, 22B of the fuse module 14 and are welded to each other when vertically aligned. In this case, even though the position of the fuse module 14 is dislocated horizontally relative to the connector module 13 owing to the deformation of the bus bars 16, 20 during welding of the welding portions 16c and 20a to each other and the welding portions 16e and 20b to each other, the dislocation of the fuse module 14 can be allowed. This is because the horizontally projecting welding portions 16e and 20b are superimposed on each other in such a way that the horizontal surfaces thereof to be welded to each other are parallel with the dislocation direction of the fuse module 14. Accordingly, it is possible to smoothly weld the horizontally projecting welding portions 16e and 20b to each other in a subsequent welding process. Further, because there is no possibility that significant stress remains in the welding portions 16e and 20b, it is possible to prevent separation of the welded portions 16e and 20b.

Figure 8A:
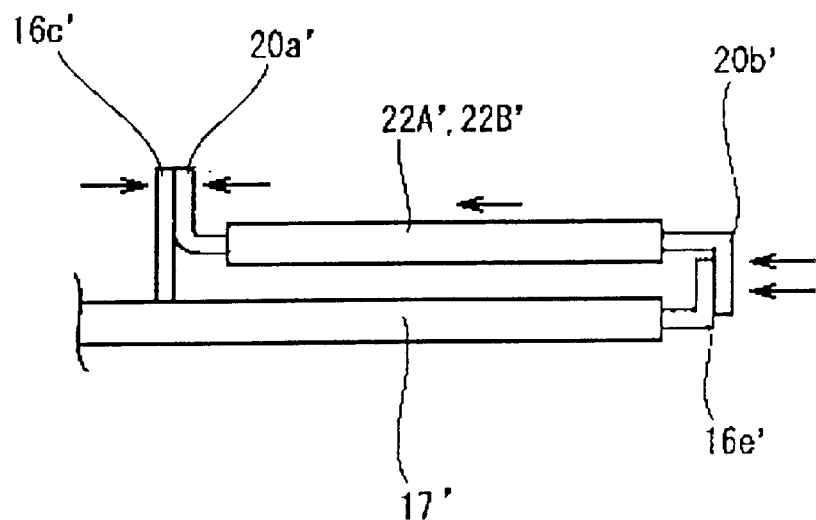
FIG. 8 shows a comparative example of a process of welding a connector module and a fuse module to each other.
Figure 8B:
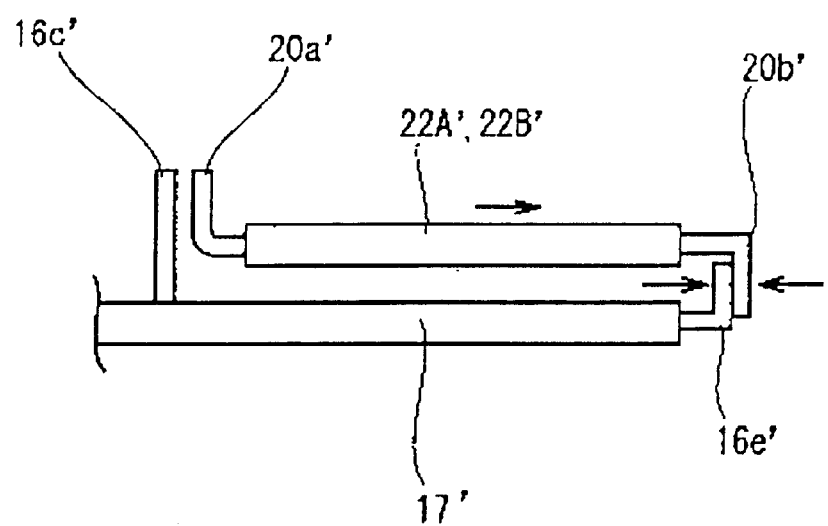

By way of comparative example, let it be supposed that the welding surface of welding portions 16c', 20a' and that of welding portions 16e', 20b' are perpendicular to the insulation plates 17', 22A', 22B', as shown in FIGS. 8A and 8B. In this case, when the welding portions 16c' and 20a' (16e' and 20b') are welded to each other, the welding portions 16e' and 20b' (16c' and 20a') have a gap therebetween or strike against each other owing to a dislocation among the insulation plates 17', 22A', 22B'. Thus, an operator has difficulty in performing a welding operation. Because the direction of the dislocation among the insulation plates 17', 22A', 22B' and the direction of the connection between the welding portions 16e' and 20b' (16c' and 20a') intersect with each other, it is impossible to absorb the dislocation. Therefore, a high residual stress may be generated at the welding portions, which may cause the separation of the welding portions.

Then, in the present invention the welding portion 30a of the bus bar 30 is superimposed on and welded to the welding portion 16d of the bus bar 16, with the relay module 15 disposed over one side of the connector module 13. The welding portions are welded to each other by ultrasonic welding, resistance welding, gas welding or laser welding.

As described above, the fuse module 14 is mounted over the connector module 13 at one widthwise side thereof, and the relay module 15 is disposed under the connector module 13 at one longitudinal side thereof to integrate the three modules. Then, this subassembly of the three modules 13, 14 and 15 is accommodated in the lower case part 11. In this case, the terminal portions of the connector module 13 are disposed in the connector receiving sockets 11a, and the terminal portions 30c of the relay module 15 are disposed in the relay receiving sockets 11b.

Figure 2:
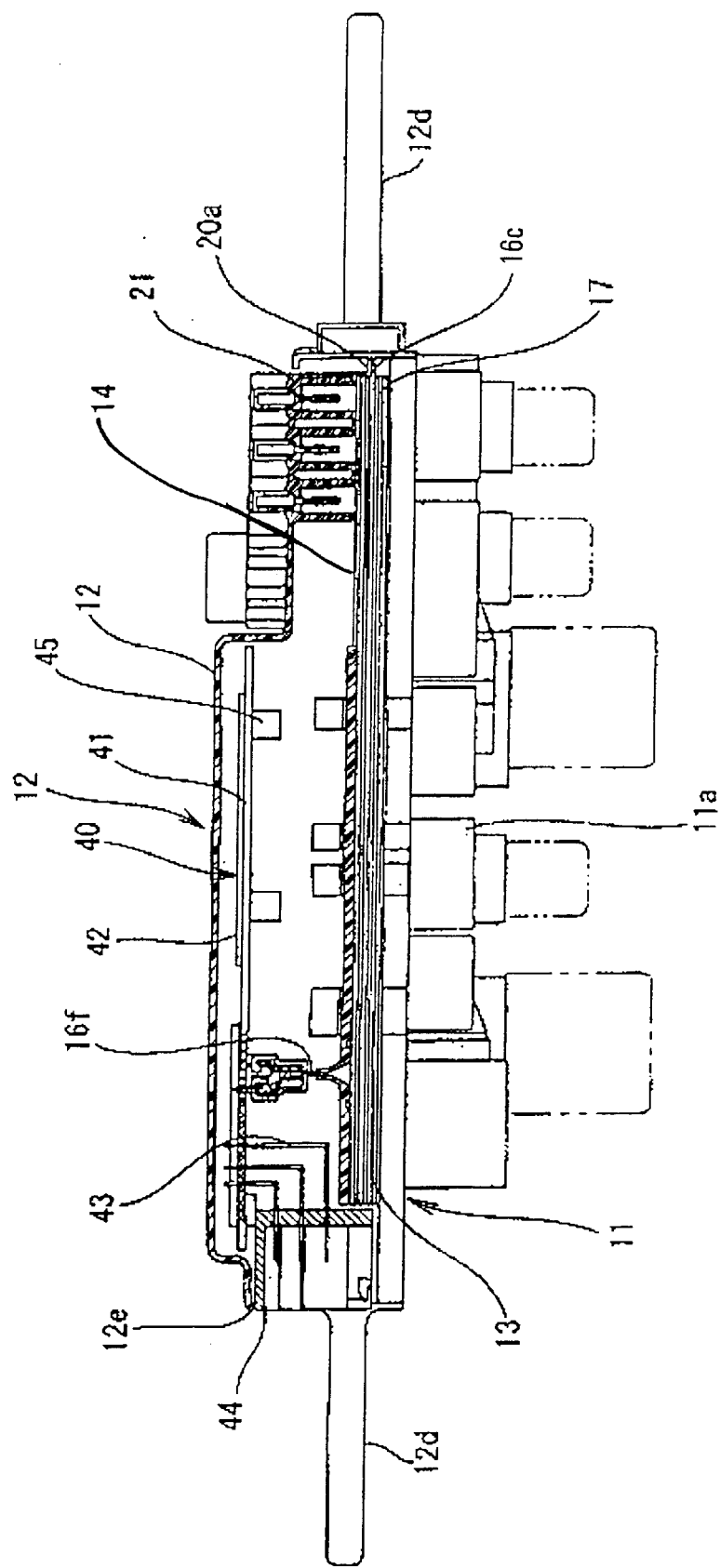
FIG. 2 is a sectional view showing a state in which the junction box of FIG. 1 has been assembled.
Figure 3:
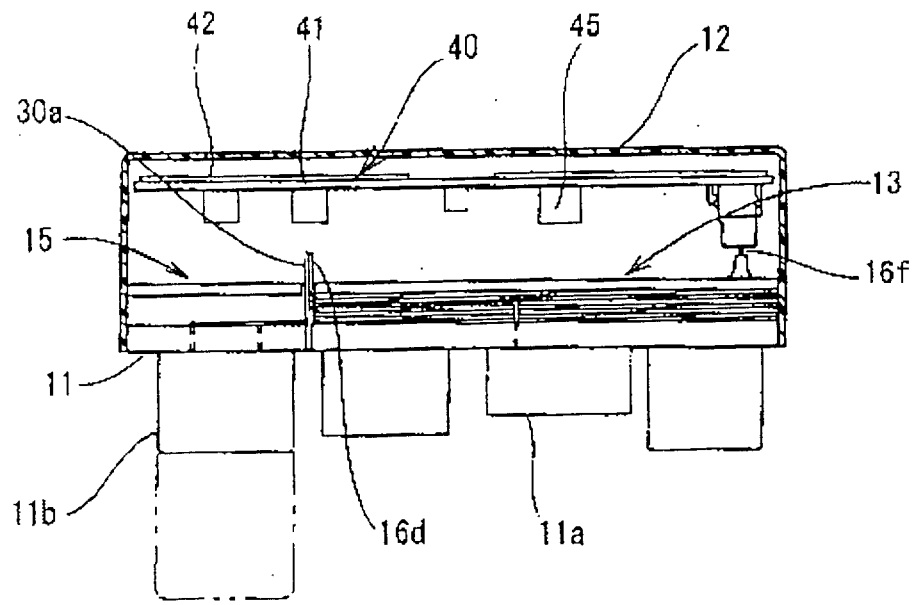
FIG. 3 is a sectional view, showing the junction box of FIG. 2, taken along a line perpendicular to FIG. 2.

Then, the electronic control unit 40 is mounted on the connector module 13 at a portion thereof on which the fuse module 14 is not mounted (see FIGS. 2 and 3). The electronic control unit 40 has, at one side thereof, a connector portion 44 having bent and projecting conductive pins 43 connected with electrical conductors 42 fixed to a substrate 41 thereof. The electrical conductors 42 are connected to tabs 16f projecting from the bus bars 16 of the connector module 13. The conductors 42 are connected to a large number of electronic component parts 45 mounted on the substrate 41. The electronic component parts 45 fixed to the substrate 41, with the electronic component parts 45 projecting downward. The welding tabs of the bus bars 16, 20 and 30 are disposed in a dead space below the electronic control unit 40.

After the electronic control unit 40 is mounted on the connector module 13, the upper case part 12 is mounted on the lower case part 11. At this time, the terminal portions 20c of the bus bars 20 fixed to the fuse module 14 become located in the fuse receiving portions 12a.

At this time, the connector portion 44 of the electronic control unit 40 is fitted in a notch 12e of the upper case 12. The assembling of the junction box 10 is completed by locking the upper case 12 and the lower case 11 to each other.

Figure 6:
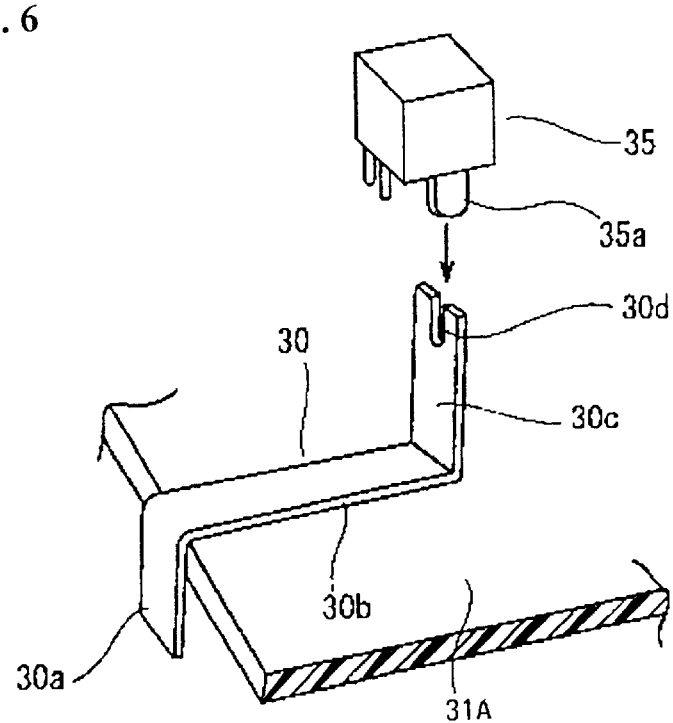
FIG. 6 is a schematic view showing a relay connection bus bar.

As shown in FIGS. 5 and 6, when the fuses 25 and the relays 35 are inserted into the fuse accommodation portion 11a and the relay accommodation portion 11b, respectively, they are fitted in and connected to the pressure connection grooves 20d of the fuse connection bus bars 20 and the pressure connection grooves 30d of the relay connection bus bars 30, respectively.

In the first embodiment, the vertically projecting welding portions 16c and 20a and the horizontally projecting welding portions 16e and 20b are welded to each other respectively to connect the connector module 13 and the fuse module 14 to each other. But the connector module 13 and the relay module 15 can be connected to each other by welding the welding portions in a similar manner.

Figure 9A:
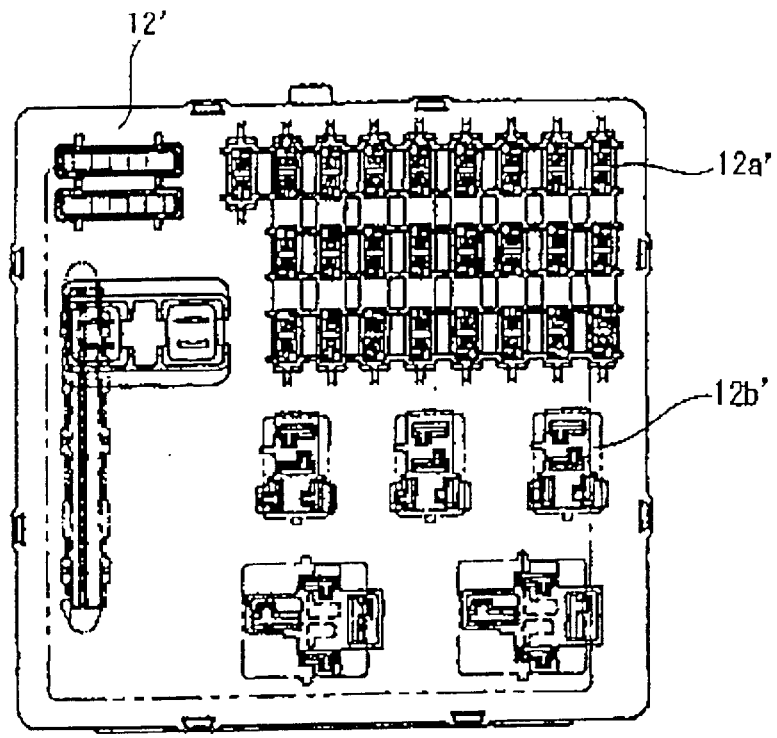
FIG. 9A is a plan view and FIG. 9B is a bottom view of a junction box of another embodiment of the present invention.
Figure 9B:
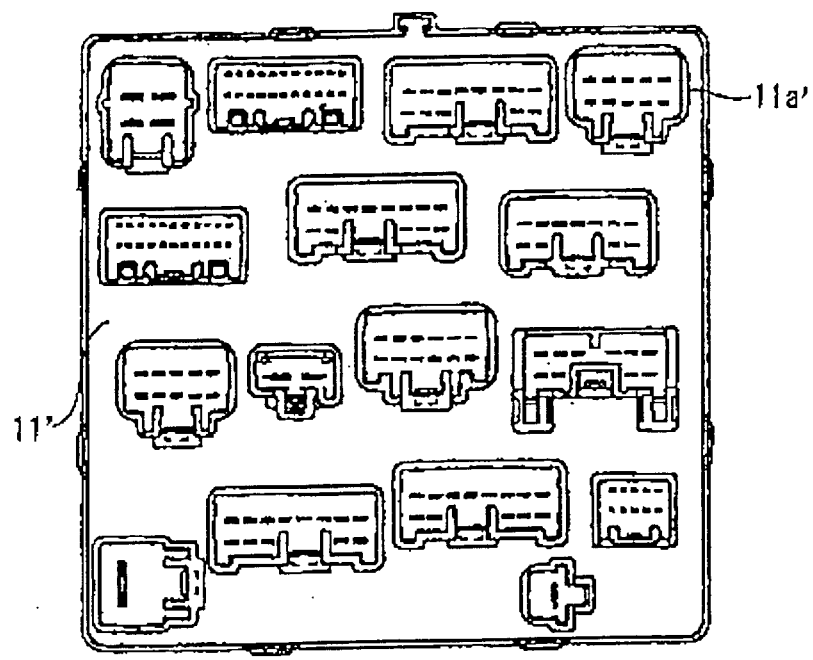
Figure 10:
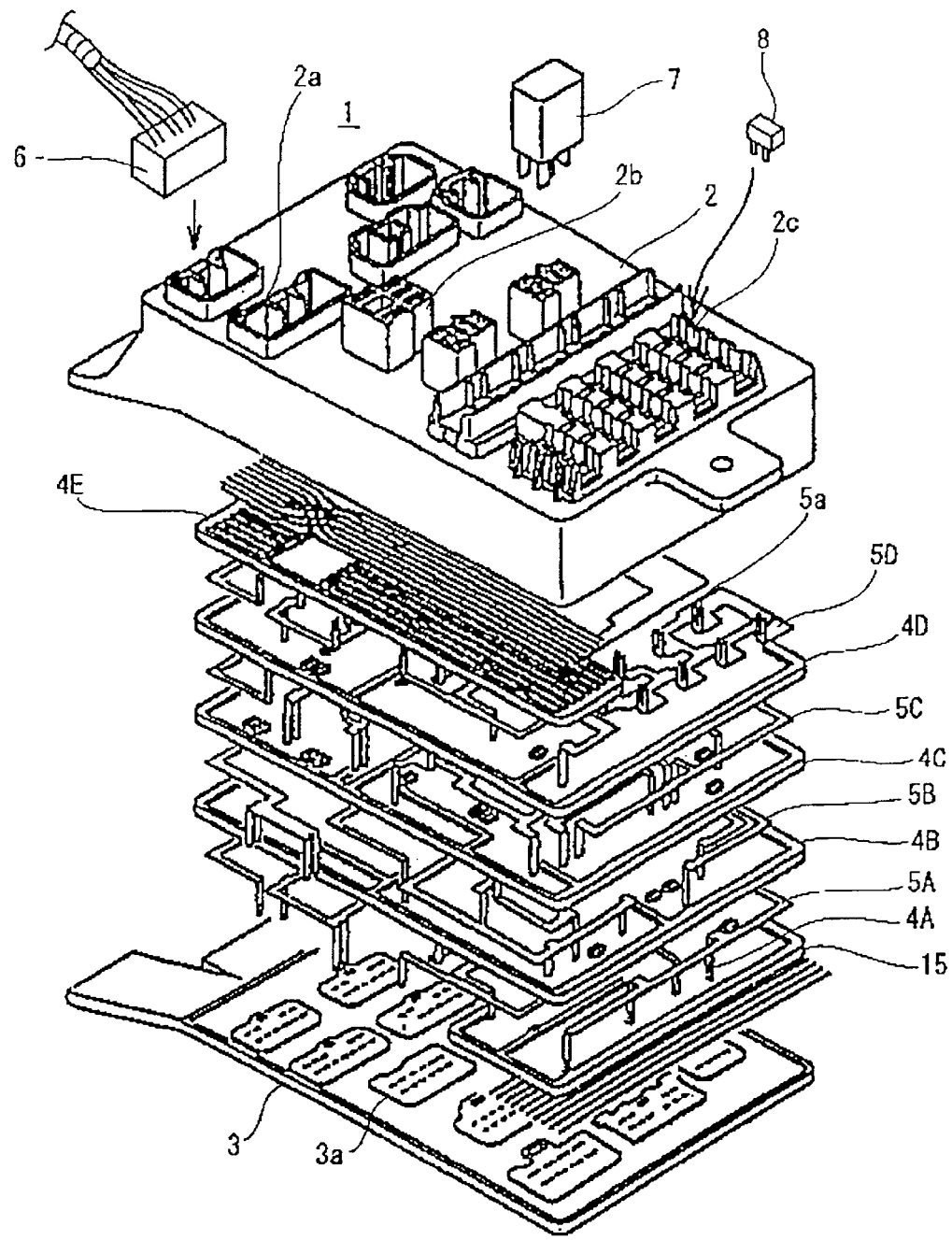
FIG. 10 is an exploded perspective view showing a conventional junction box.

In the first embodiment described above, the fuse module and the relay module are separate from each other. Instead, the fuse module and the relay module may be integral with each other to form a composite module. In this case, as shown in FIGS. 9A and 9B, a fuse receiving portion 12a' and a relay receiving portion 12b', in which terminal portions of bus bars of the composite module are disposed, are formed in the upper case 12'. Formed in the lower case 11' is a connector receiving portion 11a' in which terminal portions of bus bars of the connector module are disposed.

The junction box of the present invention is not limited the above-described embodiments. For example, each of the fuse module and the relay module may be divided into two parts, respectively. In this case, when the specification of any one of the fuses or the relays is altered, it is possible to replace only the module associated with the fuse or the relay which should be altered. However, if the fuse module and the relay module are divided into three or more parts, many assembling stages are required. Thus, it is preferable to divide the fuse module and the relay module into at most two parts, respectively, in the case of a large junction box.

The connector connection bus bars of the connector module, the fuse connection bus bars of the fuse module, and the relay connection bus bars of the relay module may be welded to each other in any of the following three patterns, selected according to the circuit design:

(1) A connector connection bus bar and a fuse connection bus bar are welded to each other.

(2) A connector connection bus bar and a relay connection bus bar are welded to each other.

(3) A connector connection bus bar is welded to a fuse connection bus bar and to a relay connection bus bar.

In case (3), the fuse connection bus bar may be welded to a welding portion of the connector connection bus bar at one end thereof; the relay connection bus bar may be welded to the welding portion of the connector connection bus bar at the other end thereof; and a tab provided at a third portion of the connector connection bus bar may be connected to a connector.

In the first embodiment, the connector module and the electronic control unit are accommodated in the lower and upper case parts. Additionally, it is possible to add a circuit including electrical wires connected to pressure contact terminals on the base circuit. The wires may also connect to connectors which fit in the connector receiving portion. It is also possible to add a circuit formed as an electrically conductive portion of an FPC (flexible printed circuit), a PCB (printed circuit board) or a highly electrically conductive resin molded with insulating resin.

As is apparent from the foregoing description, in the method of the present invention, in connecting the connector module to the fuse module and/or the relay module, after the vertically projecting welding portions are welded to each other by superimposing them on each other, the horizontally projecting welding portions are welded to each other by superimposing them on each other. Thus, even though the position of the fuse module and/or the relay module is dislocated horizontally relative to the connector module after the vertically projecting welding portions are welded to each other, such dislocation of the fuse module and/or the relay module causes no problem and can be allowed. This is because the horizontally projecting welding portions are superimposed on each other in such a way that the horizontal surfaces thereof to be welded to each other are parallel with the dislocation direction of the fuse module and/or the relay module. Accordingly, it is possible to smoothly weld the horizontally projecting welding portions to each other in a subsequent welding process. Further, there is no possibility that a great stress remains in the welding portions.

As is apparent from the foregoing description, in the junction box of the present invention, the connector connection bus bars are separately provided from the fuse connection bus bars and the relay connection bus bars, using discrete substrates. Thus, tabs for connecting the connector connection bus bars, the fuse connection bus bars, and the relay connection bus bars to connectors, fuses and relays, respectively are disposed at different positions and do not overlap each other. Accordingly, it is unnecessary to increase the number of layers of the bus bars to provide them with tabs. Consequently, it is possible to form a thin junction box or otherwise to achieve a compact and logical lay out. For example, in the case of the construction of the first embodiment, the number of bus bars can be reduced from six layers required in the conventional junction box to four layers. Thus, it is possible to reduce the thickness of the junction box.

Further, as described above, because the fuse connection tabs and the relay connection tabs are separate from the bus bars of the base circuit, it is easy to handle and arrange the bus bars of the base circuit. Thus, it is possible to reduce the area of the bus bars and hence the area of the junction box. Consequently, in the case where the bus bars are divided and the ends of the bus bars are welded to each other, the area of the entire bus bars is not large and hence the area of the junction box is not increased.

Further, if the specification of the fuses and the relays is altered, the fuse module, the relay module or the composite module of the fuse module and the relay module is replaced. Thus, it is unnecessary to alter the entire upper and lower cases including the base circuit. That is, the construction can permit the alteration of the specification quickly and at low cost.

While the invention has been illustrated by the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. A method of assembling an electrical junction box adapted to provide electrical connection to a plurality of electrical connectors, a plurality of fuses and a plurality of relays, said method comprising:
   (i) assembling in a casing the following components:
      (a) a connector circuit having at least one connector circuit insulation substrate having opposite main surfaces and a periphery around said main surfaces, a plurality of first bus bars fixed on said insulation substrate, the first bus bars being arranged to provide electrical connection to electrical connectors in use and having at least one first welding portion at an end of a corresponding one of said first bus bars and standing up from one of said main surfaces and at least one second welding portion formed at an end of a corresponding one of said first bus bars and extending laterally from said periphery of said insulation substrate;
      (b) a fuse circuit having at least one fuse circuit insulation substrate, which is discrete from said connector circuit, and a plurality of second bus bars fixed on said fuse circuit insulation substrate, the second bus bars being arranged to provide electrical connection to fuses in use; and
      (c) a relay circuit having at least one relay circuit insulation substrate, which is discrete from said connector circuit, and a plurality of third bus bars fixed on the relay circuit insulation substrate, the third bus bars being arranged to provide electrical connection to relays in use;
   at least one of said fuse circuit and said relay circuit having a third welding portion at an end of a corresponding one of said bus bars thereof and upstanding away from said insulation substrate thereof and a fourth welding portion at an end of a corresponding one of said bus bars thereof and extending laterally from said insulation substrate thereof;
   the assembling step including the steps of:
      (ii) joining said first and third welding portions to form a welded connection by arranging them lying adjacent each other and welding them together; and
      (iii) after step (ii), joining said second and fourth welding portions to form a welded connection by welding them together when superimposed one of the other.

2. A method according to claim 1, wherein joining said first and third welding portions comprises welding a plurality of said first welding portions, which are arranged in a row, to a plurality of said third welding portions also arranged in a row, and wherein joining said second and fourth welding portions comprises welding a plurality of said second welding portions which are arranged in a row to a plurality of said fourth welding portions which are also arranged in a row.

* * * * *